United States Patent
Natarajan et al.

(10) Patent No.: US 11,302,405 B2
(45) Date of Patent: Apr. 12, 2022

(54) SYSTEM APPROACH TO REDUCE STABLE THRESHOLD VOLTAGE (VT) READ DISTURB DEGRADATION

(71) Applicant: Intel Corporation, Santa Clara, CA (US)

(72) Inventors: Sriram Natarajan, Folsom, CA (US); Shankar Natarajan, Folsom, CA (US); Yihua Zhang, Cupertino, CA (US); Hinesh K. Shah, Folsom, CA (US); Rohit S. Shenoy, Fremont, CA (US); Arun Sitaram Athreya, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 16/709,749

(22) Filed: Dec. 10, 2019

(65) Prior Publication Data

US 2020/0118637 A1   Apr. 16, 2020

(51) Int. Cl.
*G11C 16/34* (2006.01)
*G11C 16/28* (2006.01)
*G06F 3/06* (2006.01)

(52) U.S. Cl.
CPC ........ *G11C 16/3431* (2013.01); *G06F 3/0659* (2013.01); *G06F 3/0688* (2013.01); *G11C 16/28* (2013.01); *G11C 16/3427* (2013.01)

(58) Field of Classification Search
CPC ............................ G11C 16/3431; G11C 16/28

USPC ........................................................ 365/185.2
See application file for complete search history.

(56) References Cited

U.S. PATENT DOCUMENTS

| | | | |
|---|---|---|---|
| 10,008,275 B1 | 6/2018 | Khwa et al. | |
| 2003/0092236 A1 | 5/2003 | Shum et al. | |
| 2014/0362062 A1 | 12/2014 | Limketkai et al. | |
| 2016/0118129 A1 | 4/2016 | Muchherla et al. | |
| 2017/0262197 A1* | 9/2017 | Tan | G06F 3/065 |
| 2017/0365349 A1* | 12/2017 | Pang | G11C 16/26 |
| 2019/0066771 A1 | 2/2019 | Binfet et al. | |
| 2019/0243704 A1 | 8/2019 | Muchherla et al. | |
| 2019/0267104 A1* | 8/2019 | Lee | G11C 16/08 |
| 2019/0347039 A1* | 11/2019 | Velusamy | G06F 13/1605 |
| 2019/0391865 A1 | 12/2019 | Cadloni et al. | |

OTHER PUBLICATIONS

Extended European Search Report for Patent Application No. 20197333.6, dated Feb. 17, 2021, 8 pages.

* cited by examiner

*Primary Examiner* — Anthan Tran
(74) *Attorney, Agent, or Firm* — Compass IP Law PC

(57) ABSTRACT

A nonvolatile (NV) memory device includes an NV storage media and a storage controller to control access to the NV storage media. In response to a host read request, the storage controller can determine if the NV storage media is in a stable Vt (threshold voltage) state. If the NV storage media is in a stable Vt state, the storage controller can perform a reset read operation prior to servicing the host read request. A reset read is a read operation that does not produce data to send back to the host. The reset read operation is a dummy read that puts the NV storage media into a transient Vt state, which has lower risk of read disturb.

20 Claims, 9 Drawing Sheets

SYSTEM APPROACH TO REDUCE STABLE THRESHOLD VOLTAGE (VT) READ DISTURB DEGRADATION

FIELD

Descriptions are generally related to nonvolatile memory systems, and more particular descriptions are related to reduction of read disturb in a nonvolatile memory system.

BACKGROUND

Certain nonvolatile memory devices are susceptible to hot electron read disturb. Hot electron read disturb refers to unexpected change of data values in a part of a wordline or block of memory that is not the target of a read command, but is charged to service the read request. An example of nonvolatile memory devices particularly susceptible to such read disturb are three dimensional (3D) NAND (not AND) devices.

In some devices, the degradation due to read disturb is worse when reads are performed when the NAND channel is in a stable Vt (voltage threshold) state. If a read is performed when a channel is in a stable Vt state, the number of errors can increase, resulting in uncorrectable errors. The stable Vt state refers to a condition when the channel is in thermal equilibrium. When in thermal equilibrium, more energy input is required for charge carrier mobility, which increases the potential of causing unwanted effects non-selected bitcells on the selected wordline.

The stable Vt read disturb typically affects the storage device for random reads rather than for sequential reads. The read scenario could be to read the page, then delay, and then access the same page. Reference to a page can be a portion of a wordline controlled by the select gates, where a page can be a subblock. Thus, read access repetition of a particular wordline on the order of 10K or 20K accesses could cause read disturb on another subblock of the block.

There are certain hardware solutions to mitigate disturb degradation from stable Vt read. The hardware solutions can include building margin into the read operation of the device, applying hardware control to reduce the effects of stable Vt operation, or providing other hardware modification of the device to control the stable Vt characteristics of the memory device. It will be understood that such hardware controls do not tend to scale well. The hardware implementations tend to add cost to the devices and increase the footprint of the control circuitry.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
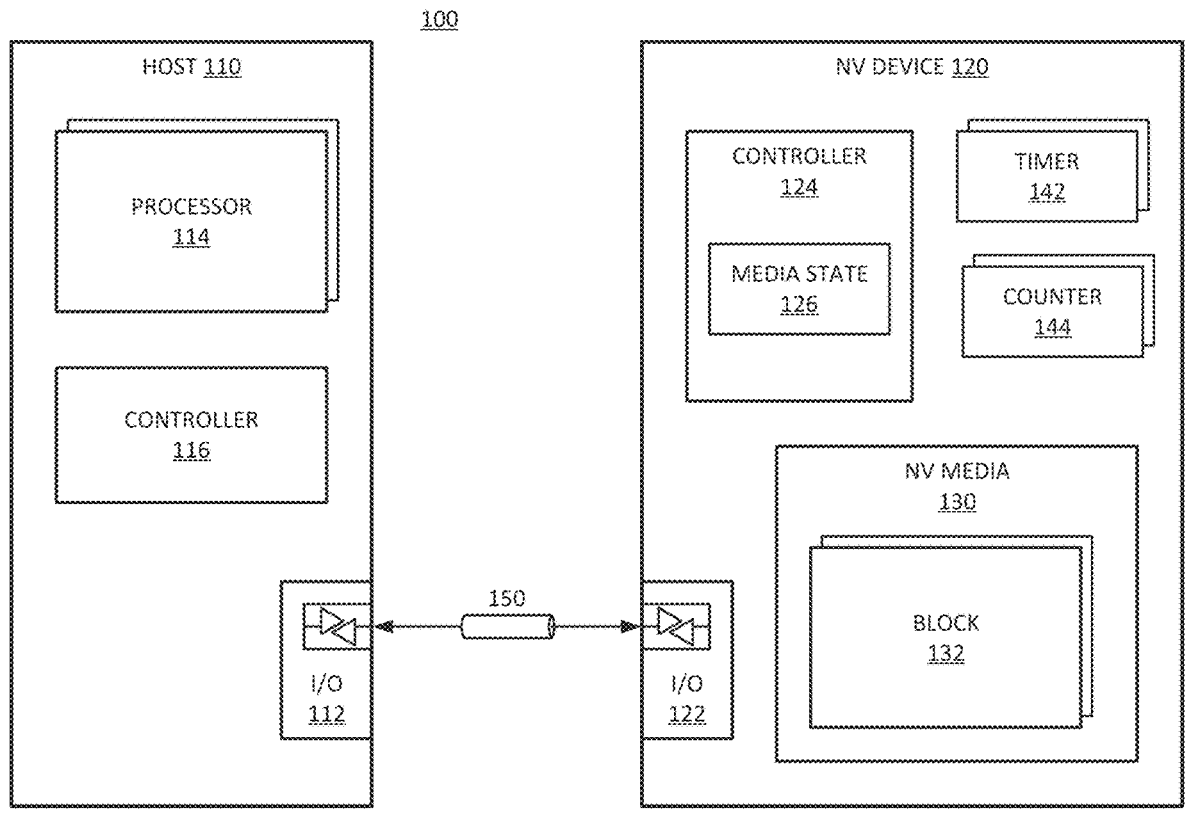
FIG. 1 is a block diagram of an example of a system that services reads from a transient threshold voltage state.

Descriptions of certain details and implementations follow, including non-limiting descriptions of the figures, which may depict some or all examples, and well as other potential implementations.

DETAILED DESCRIPTION

As described herein, a nonvolatile (NV) memory device includes an NV storage media and a storage controller to control access to the NV storage media. If the NV storage media is in a non-excited state (thermal equilibrium or stable Vt (voltage threshold)), the storage controller can cause the NV storage media to enter an excited state prior to servicing the read request. In one example, the storage controller performs a dummy read or a reset read to change the NV storage media from thermal equilibrium to a state of thermal non-equilibrium to service the next host read in the excited state. Ensuring that the read is serviced from a transient Vt state instead of a stable Vt state can reduce the read stress.

There can be multiple factors that will put the NV media into a stable Vt state, including a time delay between subsequent read to a block or multiple block erase operations. The time delay refers to a long enough time delay between subsequent reads that the NV media channel enters a stable Vt state. The time delay will vary for different NV media and for different processes. The multiple block erase operations refer to erase operation on the block of NV media; once a threshold number of erase operations has occurred, the NV media channel will enter a stable Vt state. The threshold number will vary for different NV media and for different processes.

In one example, in response to a host read request, the storage controller can determine if the NV storage media is in a stable Vt (threshold voltage) state. If the NV storage media is in a stable Vt state, the storage controller can perform a reset read operation prior to servicing the host read request. A reset read is a read operation that does not produce data to send back to the host. The reset read operation is a dummy read that puts the NV storage media into a transient Vt state for servicing the read request.

In one example, the operation by the storage controller to manage the read from a transient Vt state can be controlled by firmware for the storage controller. A firmware approach provides a system solution that can scale with NV media and can adapt to different processes and media. In one example, the storage controller includes threshold information to manage the transient Vt state. In one example, the threshold information is programmable to allow for programmable firmware to adapt the storage controller to different media.

The control in the storage controller can reduce or eliminate the hot electron read disturb mechanism by avoiding reading the NV media while in a stable Vt state. Not only can such operation eliminate hot electron read disturb, but can also reduce or eliminate second order effects resulting from stable Vt reads, which provides better quality and reliability for NV media devices, such as solid state drives (SSDs). Traditional read disturb management involve relocating the data to a new location. However, relocating data involves a performance cost as large amounts of data are moved (e.g., approximately 1 GB for one QLC (quad level cell) block).

Relocating data can also create write amplification due to the rewriting of cold data. Write amplification refers to the increase of operations to perform background write operations to erase or transfer data in addition to the operations performed to actually service the access request received from the host. In contrast to the traditional approach with data relocation, the transition of the Vt state to a transient state prior to servicing the read does not involve data relocation.

FIG. 1 is a block diagram of an example of a system that services reads from a transient threshold voltage state. System 100 includes host 110 coupled to NV device 120. Host 110 represents a computing device. Host 110 includes I/O (input/output) 112, which represents hardware to interconnect with NV device 120. NV device 120 includes I/O 122 which corresponds to I/O 112. I/O 122 represents hardware to interconnect with host 110.

Host 110 provides a hardware platform to operate NV device 120. Host 110 includes one or more processors 114 to perform the operations of host 110. Processor 114 executes a host operating system (OS) that provides a software platform for the operation of NV device 120. The hardware platform provides hardware resources to interface with NV device 120 including transceiver hardware to perform access to the device. The software platform includes control software to execute other software elements such as applications or other agents that execute under the OS and create requests to access NV device 120.

I/O 112 and I/O 122 interconnect through one or more signal lines 150. Signal lines 150 typically include multiple separate lines and can be considered one or more buses to connect host 110 to NV device 120. Host 110 can send a host read command over signal line 150 to NV device 120. In response to the read command, NV device 120 services the request out of a transient Vt state, in accordance with any example provided.

In one example, host 110 includes controller 116. Controller 116 represents a memory controller or storage controller. In one example, controller 116 is integrated with processor 114. In one example, controller 116 is separate from processor 114. Controller 116 enables host 110 to manage access to NV device 120. In response to host operations by processor 114 that request access to data on NV device 120, controller 116 provides access to NV device 120. Controller 116 can represent hardware and firmware elements of host 110 to enable interaction with NV device 120.

NV device 120 includes controller 124, which represents a storage controller at the side of the storage device, which is separate from controller 116 of host 110. Controller 116 of host 110 represents components of the host system. Controller 124 represents components of the storage device or memory device into which the NV media is incorporated. Controller 124 receives commands send from host 110 and determines how to service the command or request from the host. Controller 124 performs operations to access (e.g., read or write) NV media 130 in response to the host command.

NV media 130 represents a nonvolatile storage media of NV device 120. In one example, NV media 130 includes three dimensional (3D) NAND (not AND) memory cells. In one example, NV media 130 includes 3D NOR memory cells. In one example, NV media 130 includes 3D crosspoint memory cells.

NV media 130 includes bitcells or memory cells organized as blocks 132. A block of memory refers to a portion of NV media 130 that is jointly charged or activated for an access operation. In one example, blocks 132 are subdivided as subblocks. In one example, a block refers to bitcells that share a select gate line. In one example, multiple subblocks share a select gate (e.g., a common select gate source (SGS) or a common select gate drain (SGD)) connector.

In one example, a block refers to an erase unit, or a unit size of NV media 130 that is erased together and monitored by controller 124 for number of writes. In one example, NV media 130 includes single level cell (SLC) and multilevel cell (MLC) media. For example, NV media 130 can include SLC and QLC (quad level cell) or SLC and TLC (triple level cell) bitcells. The block size could be different depending on the media type.

In one example, controller 124 is an ASIC (application specific integrated circuit) that controls operation of NV device 120. In one example, controller 124 is a CPU (central processing unit) core or processor device on NV device 120. In one example, NV device 120 represents an SSD and controller 124 controls multiple NV media dies or NV media chips integrated into the SSD. In one example, NV device 120 represents a module or PCB (printed circuit board) that includes multiple NV media dies or NV media chips integrated onto it and controller 124 controls the NV media dies of the module. In one example, controller 124 executes firmware to manage NV device 120. In one example, controller 124 executes firmware to manage NV device 120, including firmware to control the servicing of a read command based on whether the NV media is in thermal equilibrium.

In one example, controller 124 manages Vt state detection and read command servicing based on idle time or delay between consecutive read commands. In one example, controller 124 monitors one or more media states 126. Media state 126 represents a state of a portion of memory (such as a block) and can determine how to access the media based on media state 126. For example, if media state 126 indicates that a target block is in a stable state, controller 124 can first issue a dummy read prior to accessing the target block.

In one example, NV device 120 includes one or more timers 142 to keep track of an amount of time that has elapsed in one or more states to determine if NV media 130 is in a stable Vt state. In one example, timer 142 can be included within controller 124. In one example, timer 142 is outside controller 124 and accessible to the controller.

In one example, controller 124 manages Vt state detection and read command servicing based on a number of operations (such as a number of erase operations) since a last read or a number of operations per a unit time since a previous read command. In one example, NV device 120 includes one or more counters 144 to keep track of the count to determine if NV media 130 is in a stable Vt state. In one example, counter 144 can be included within controller 124. In one example, counter 144 is outside controller 124 and accessible to the controller.

It will be understood that a timer or a counter can be executed in a similar manner. One or more counters and one or more timers could be used in system 100. System 100 could include timers and counters to track Vt state in different ways. Client SSD workloads are expected to handle power cycles (whether safe shutdown or unsafe shutdown), non-operational NVMe (extended nonvolatile media interface) power states such as PS3 (power state 3) and PS4 (power state 4), which are both low power states, and operational NVMe power states such as PS0, PS1, and PS2.

In one example, controller 124 manages stable Vt state detection and read servicing based on the Vt state as follows. When NV media 130 is not in a Vt stable state, controller 124 can service a read command as normal, by simply accessing the addressed space. When NV media 130 is in a Vt stable state, controller 124 performs a dummy read prior to servicing the read command, to transition the media to a transient state before servicing the read. The dummy read can be referred to as a reset read, as the non-functional read operates to transition the NV media to a transient state. The reset read is non-functional because the read operation is performed but the data is not to be returned to the host.

For a power off or shutdown state, NV device 120 cannot know how much time was spent in the power off state. In one example, controller 124 declares all blocks to be in a stable Vt state when resuming from a power cycle, whether a safe or unsafe shutdown. Detecting all blocks as being in a stable Vt state removes the need to determine how long the power cycle lasted.

For an operational runtime or power on state (e.g., operational states such as PS0, PS1, PS2), in one example, controller 124 tracks the time delay between consecutive reads to each block 132 being monitored. For example, controller 124 can use timer 142 for one or more blocks 132. In one example, there is a timer per block. In one example, there are fewer timers than there are blocks, and a heuristics algorithm determines the blocks to monitor. In one example, if a delay exceeds a time threshold, Ts (stable time threshold), then the block is detected to be in a stable Vt state.

In one example, for the runtime or power on state, controller 124 tracks the number of erase operations per block. For example, controller 124 can use counter 144 for one or more blocks 132. In one example, there is a counter per block. In one example, there are fewer counters than there are blocks, and a heuristics algorithm determines the blocks to monitor. In one example, if the number of erases exceeds a threshold, Ne (number of erase threshold), then all blocks are detected be in a stable Vt state.

For a non-operational power on state (e.g., non-operational states such as PS3, PS4), in one example, controller 124 maintains a timer 124 as a realtime clock (RTC) counter in an always-on power domain, which has the capability to measure the time spent in the non-operational state. It will be understood that for power management, certain components are in power domains that are gated or shut off during low power states, while other components remain in a domain where power continues to be applied in the low power states. Gating components in operational, low power states differs from power cycle states where power is interrupted to all domains. Different domains can exist for different states of power saving, resulting in different power states depending on which domains remain powered.

When controller 124 receives a read command when NV device 120 is in a non-operational power state, controller 124 transitions the device from the non-operational state to an operational power state to service the command. It will be understood that there is a delay inherent in transitioning power states. Controller 124 includes delay information to identify the transition time between various power states. In one example, controller 124 leverages the delay information to compute the comparison against the threshold Ts when detecting stable Vt state. In one example, the delay information is added to the time for all blocks.

Figure 2:
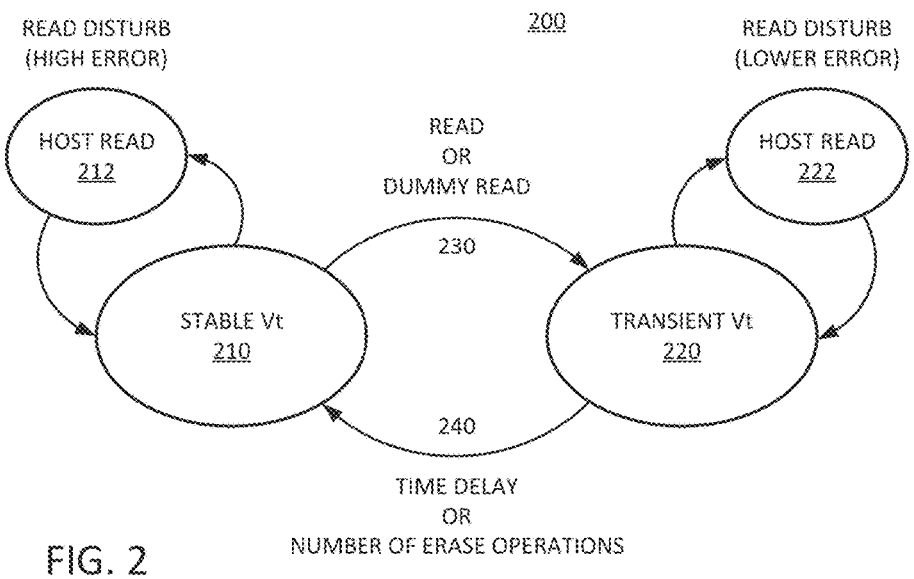
FIG. 2 is a state diagram of an example of transitioning to a transient threshold voltage state to service a host read request.

FIG. 2 is a state diagram of an example of transitioning to a transient threshold voltage state to service a host read request. Diagram 200 represents a functional state diagram describing the trigger conditions for channel Vt states for a NV device, such as NV device 120 of system 100. Diagram 200 illustrates the operation of a system mitigation policy that can avoid performing host reads in a stable Vt state.

In accordance with the example of diagram 200, a channel threshold voltage of a NV media (such as 3D NAND) can be in one of two different states, state 210 labeled "stable Vt", or state 220 labeled "transient Vt". State 210 refers to a state of thermal equilibrium, characterized by the presence of holes as conductors. State 220 refers to a state of thermal non-equilibrium where electron carriers are more abundant, reducing the presence of holes.

Host read 212 represent a host read from state 210. Host read 222 represents a host read from state 220. Both host read 212 and host read 222 are susceptible to read disturb when the number of reads exceeds a threshold. However, the number of uncorrectable errors can increase host read 212 from the stable Vt of state 210, relative to state 220. Thus, host read 212 is labeled with read disturb with high error. Host read 222 is labeled with read disturb with lower error.

During normal operation the channel Vt state can toggle between state 210 and state 220. In normal operation, a read transitions the channel Vt state from state 210 to state 220, as shown by transition 230. As shown by transition 240, a time delay or a number of erase operations transitions the channel Vt state from state 220 to state 210. In one example, a controller can monitor the state of the nonvolatile channel and transition from state 210 to state 220 prior to servicing a read request. Thus, transition 230 is also shown based on a dummy read. The use of a dummy read to control the transition to transient Vt state 220 allows a system to have some control over read disturb effects.

Transition 240 illustrates the natural operation of the Vt state from excited state to a non-excited state. Transition 230 can be caused by a dummy read to effect a change from the non-excited state to an excited state. In one example, a dummy read can be accomplished with the use of an auto reset read (ARR). ARR can be a feature of an NV device to perform dummy read operations. In one example in a NAND device, the cost for performing a dummy read through ARR is approximately 28 us (microseconds) per NAND block. In one example in a NAND device, the cost for performing a dummy read through ARR is approximately 13 ms (milliseconds) for all NAND blocks or an entire SSD. Whatever the delay cost is for the dummy read operation, in one example, the controller can select between deployment of dummy reads on a per block basis versus a dummy read on all blocks to avoid a significant quality of service (QOS) penalty.

Figures 3, 4:
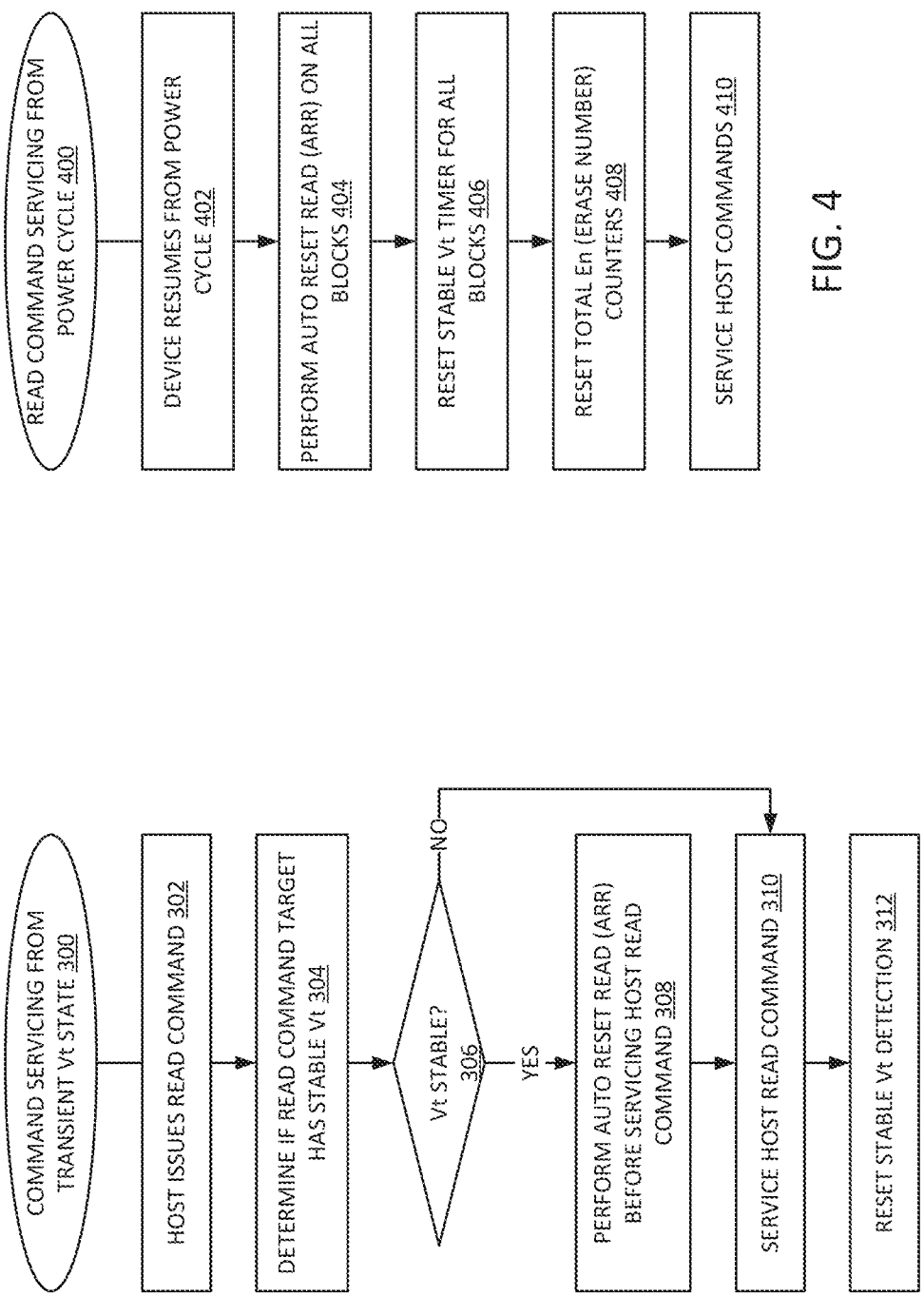
FIG. 3 is a flow diagram of an example of a process for transitioning to a transient threshold voltage state to service a host read command.
FIG. 4 is a flow diagram of an example of a process for transitioning to a transient threshold voltage state after a power cycle.

FIG. 3 is a flow diagram of an example of a process for transitioning to a transient threshold voltage state to service a host read command. Process 300 illustrates an example of a process that can be executed by a controller of an NV device, such as controller 124 of FIG. 1. In accordance with process 300, the controller can perform command servicing from a transient Vt state.

A host issues a read command to the NV device, at 302. In one example, the controller of the NV device determines if the read command target has a stable Vt state, at 304. The target of the read command can refer to a block or subblock or other portion of memory tracked for Vt state. If an addressed space to be read is within a particular block, the controller can check the block to determine if the target space for the read has a stable Vt state.

If there is a stable Vt state, at 306 YES branch, in one example, the controller performs an auto reset read (ARR) or other dummy read before servicing the host read command, at 308. The NV device can then service the host read command, at 310. In one example, if there is not a stable Vt state, at 306 NO branch, there is no need to perform a dummy read and the NV device can service the host read command, at 310.

In one example, after servicing the host read command, the controller can reset the stable Vt detection mechanism, at 312. In one example, the stable Vt detection can include a timer to determine how long the device has been in a low power state. In one example, the stable Vt detection can include a timer to determine how long it has been since a last read command. In one example, the stable Vt detection can include a counter to count a number of erases performed.

Figure 5:
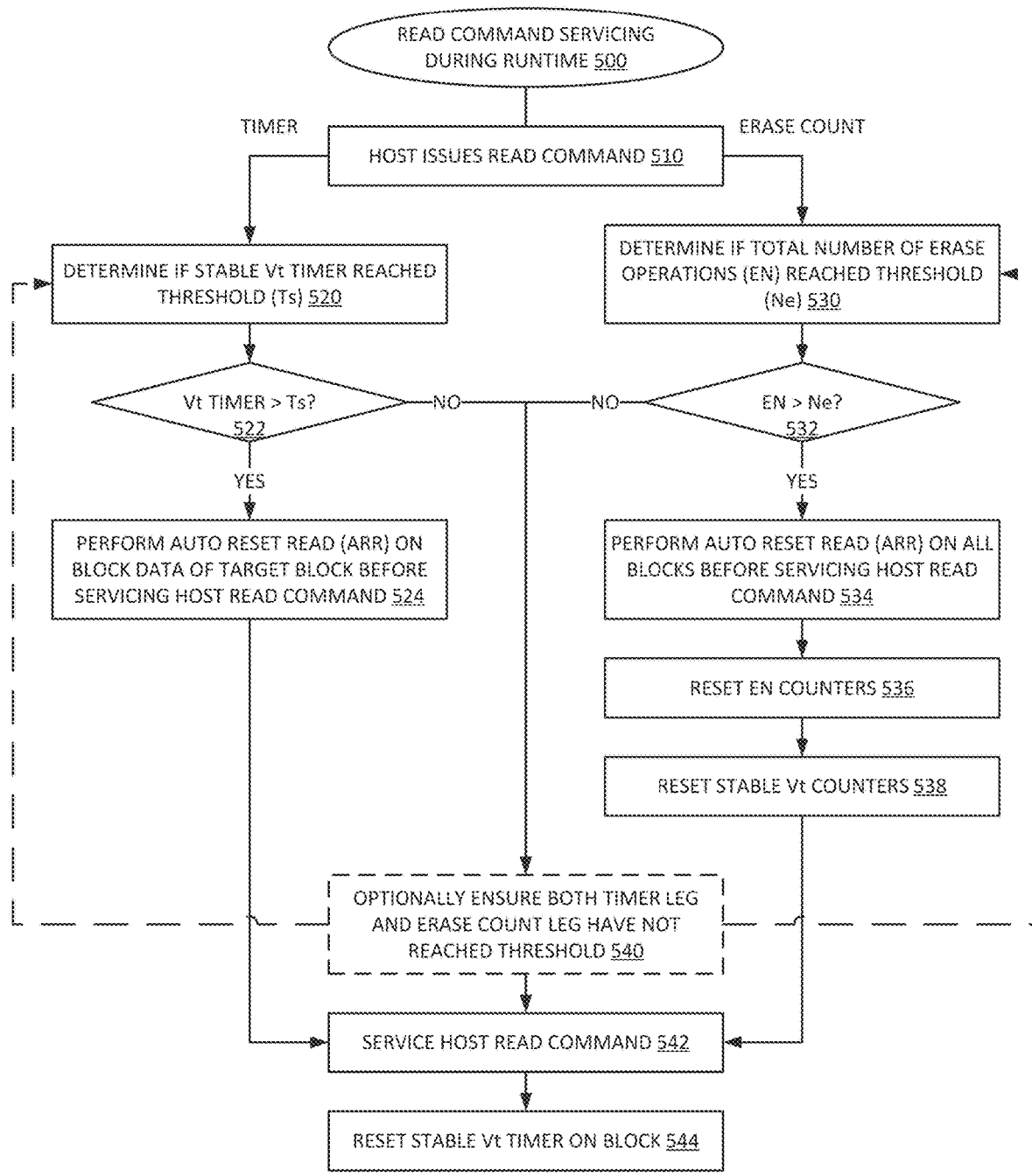
FIG. 5 is a flow diagram of an example of a process for transitioning to a transient threshold voltage state during runtime.
Figure 6:
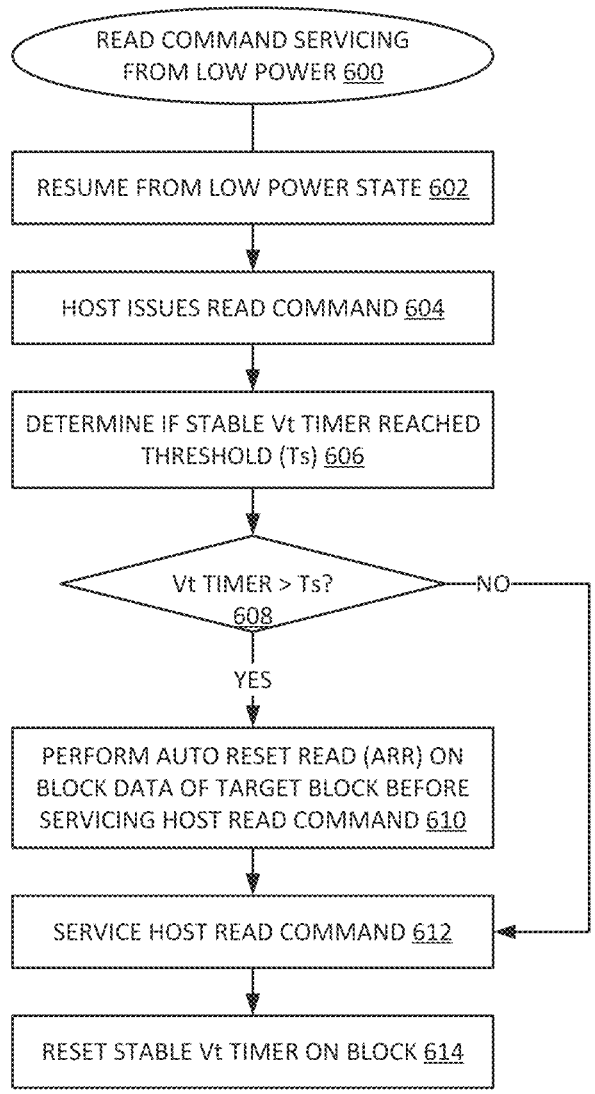
FIG. 6 is a flow diagram of an example of a process for transitioning to a transient threshold voltage state after a low power state.

Subsequent FIGS. 4, 5, and 6 describe more specific stable Vt detection and mitigation solution circumstances. The various figures describe circumstances in which a client workload could be received, such as a client SSD workload. The workload refers to request or command from the host, which can include a read command or read request.

FIG. 4 is a flow diagram of an example of a process for transitioning to a transient threshold voltage state after a power cycle. Process 400 illustrates an example of a process that can be executed by a controller of an NV device, such as controller 124 of FIG. 1. In accordance with process 400, the controller can perform read command servicing from a power cycle state. Servicing a command from a power cycle state refers to servicing a command after a boot up or power on sequence.

The NV device resumes from a power cycle. The power cycle can be a short power cycle (such as a reset) or an extended power cycle where power is off for an extended time, at 402. In one example, the controller performs an auto reset read (ARR) or other dummy read on all block, at 404. The controller can treat a power cycle event as an event that is expected to place all blocks in a stable Vt state, and thus, all should be reset prior to servicing host read commands.

In one example, the controller can reset a stable Vt timer for all blocks, at 406. Vt timers can be used to track the amount of time in low power states, and no timers need to have a value when all blocks have been reset. In one example, controller can reset En (erase number) counters, at 408. The erase count or En can be reset after all blocks have been reset. After resetting any applicable counters or timers, the controller can begin to receive and service host commands, at 410.

FIG. 5 is a flow diagram of an example of a process for transitioning to a transient threshold voltage state during runtime. Process 500 illustrates an example of a process that can be executed by a controller of an NV device, such as controller 124 of FIG. 1. In accordance with process 500, the controller can perform command servicing during runtime. Process 500 illustrates a branch that monitors stable Vt state based on a timer, and another branch that monitors stable Vt state based on erase count.

A host issues a read command to the NV device, at 510. In one example, the controller only monitors the timer. In one example, the controller only monitors the erase count. In one example, the controller utilizes both, and both conditions should be satisfied before servicing a read command.

When the controller monitors stable Vt state by timer or time-based threshold, the controller of the NV device can determine if a stable Vt timer threshold (Ts) has been reached, at 520. The check of the Vt timer can be to determine if a time or an amount of time since a last read has reached the threshold, Ts. If the Vt timer has reached or exceeded the threshold, at 522 YES branch, in one example, the controller performs an auto reset read (ARR) or other dummy read before servicing the host read command, at 524. The ARR only needs to be performed on the block of data for the target block or the block being addressed in the command.

The runtime determination for time since a last read is likely the most common scenario where the controller will detect a stable Vt state and transition the NV media to a transient state. The timer can indicate an expected saturation point for hole-based carriers in the channel. It will be understood that such a check can be performed per block, and would only require a reset read on the target block. Limiting the reset read to the target block is expected to have a low latency impact on the servicing of the command. After performing the reset read, the controller can service the host read command, at 542, and reset the stable Vt timer on the target block, at 544.

When the controller monitors stable Vt state by erase count or threshold number of erase operations, the controller of the NV device can determine if a total number of erase operations (EN, or erase number) has reached a threshold (Ne, or number of erases), at 530. The check of the erase number can check against the threshold number of erases that will end up causing a read disturb effect. It will be understood that the threshold can vary from device to device.

If the EN has reached or exceeded the threshold, at 532 YES branch, in one example, the controller performs an auto reset read (ARR) or other dummy read before servicing the host read command, at 534. With an erase, the ARR will be performed on all blocks of data as the erases can stabilize the Vt for the entire NV device. Performing ARR for all blocks is in contrast to the ARR for only a single block as with runtime timer monitoring. It will be understood that the latency impact of performing ARR for all blocks can will be higher than the latency impact for only a single block.

In one example, after performing a reset read based on erase number monitoring, the controller can reset the EN counter or counters, at 536. In one example, the controller also resets the stable Vt counters, at 538. It will be understood that if a reset has been performed on all blocks, the stable Vt counters for those blocks can be reset. Thus, a stable Vt state due to a stable Vt counter threshold will not cause a reset of the erase number, but a reset based on the erase number can cause a reset of the stable Vt counters. After performing the reset read and the counter/timer resets, the controller can service the host read command, at 542, and reset the stable Vt timer on the target block, at 544.

In one example, if the Vt timer has not reached or exceeded the Ts threshold, at 522 NO branch, or if the EN has not reached or exceeded the Ne threshold, at 532 NO branch, in one example, the controller will service the host read command, at 542. In a case where both Vt timer monitoring and erase number monitoring are performed, in one example, the controller optionally ensures that both the timer leg and the erase count leg have not reached their respective thresholds, at 540. If one threshold has not been reached, but the other threshold has, the system will still perform a corresponding reset before servicing the read request. Thus, in one example, reaching either threshold will cause the controller to perform a reset read.

FIG. 6 is a flow diagram of an example of a process for transitioning to a transient threshold voltage state after a low power state. Process 600 illustrates an example of a process that can be executed by a controller of an NV device, such as controller 124 of FIG. 1. In accordance with process 600, the controller can perform read command servicing after transition from a low power state.

The NV device resumes operation from a non-operational power state, at 602. A non-operational power state is distinguished from a power down state where power is interrupted to the entire NV device. In a non-operational power state, one or more functional components for accessing the NV media are non-powered while one or more other components remain powered.

A host issues a read command to the NV device, at 604. In one example, the NV device resumes from the low power state in response to the read command. Thus, in one example, the resume from low power could follow the issuance of the read command.

In one example, the controller of the NV device determines if a stable Vt timer has reached or exceeded a threshold (Ts), at 606. The threshold Ts refers to a threshold amount of time in low power. In one example, an NV device will already have a timer related to power up, and the controller can monitor the power up timer for purposes of resume from low power. With such an approach, the controller would only need to read the block requested.

In one example, the same timer or timers could track time since a previous read or time in a low power state. In one example, the threshold for runtime time since a last read and the threshold for low power state can be the same threshold. In one example, the storage controller can increase the time for the low power state monitoring based on an expected amount of time to transition from low power state to operational state.

If the Vt timer has reached or exceeded the threshold, 608 YES branch, in one example, the controller performs an auto reset read (ARR) or other dummy read on the block of data that is the target of the read command before servicing the host read command, at 610. The NV device can then service the host read command, at 612.

In one example, if the Vt timer has not reached or exceeded the threshold, at 608 NO branch, there is no need to perform a dummy read and the NV device can service the host read command, at 612. In one example, after servicing the host read command, the controller can reset the stable Vt timer on the target block, at 614.

It will be understood that while FIG. 4, FIG. 5, and FIG. 6 are illustrated separate from each other, in one example, a controller implements any combination of the three processes to monitor and mitigate Vt stable state. Thus, the controller could perform any combination of power off monitoring, runtime monitoring, and low power state monitoring as described.

Figure 7:
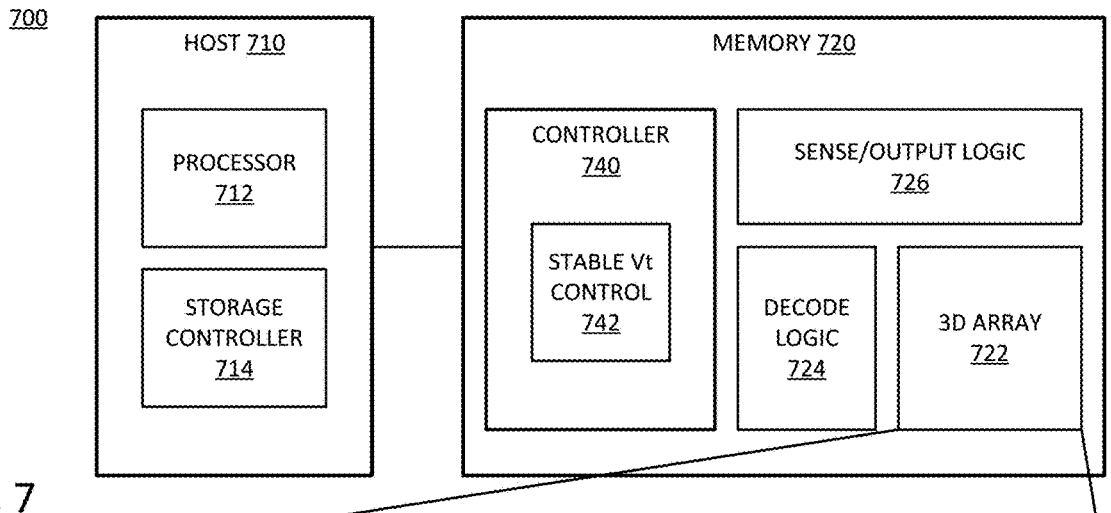
FIG. 7 is a block diagram of an example of a three-dimensional (3D) memory that services reads from a transient threshold voltage state.
Figure 7:
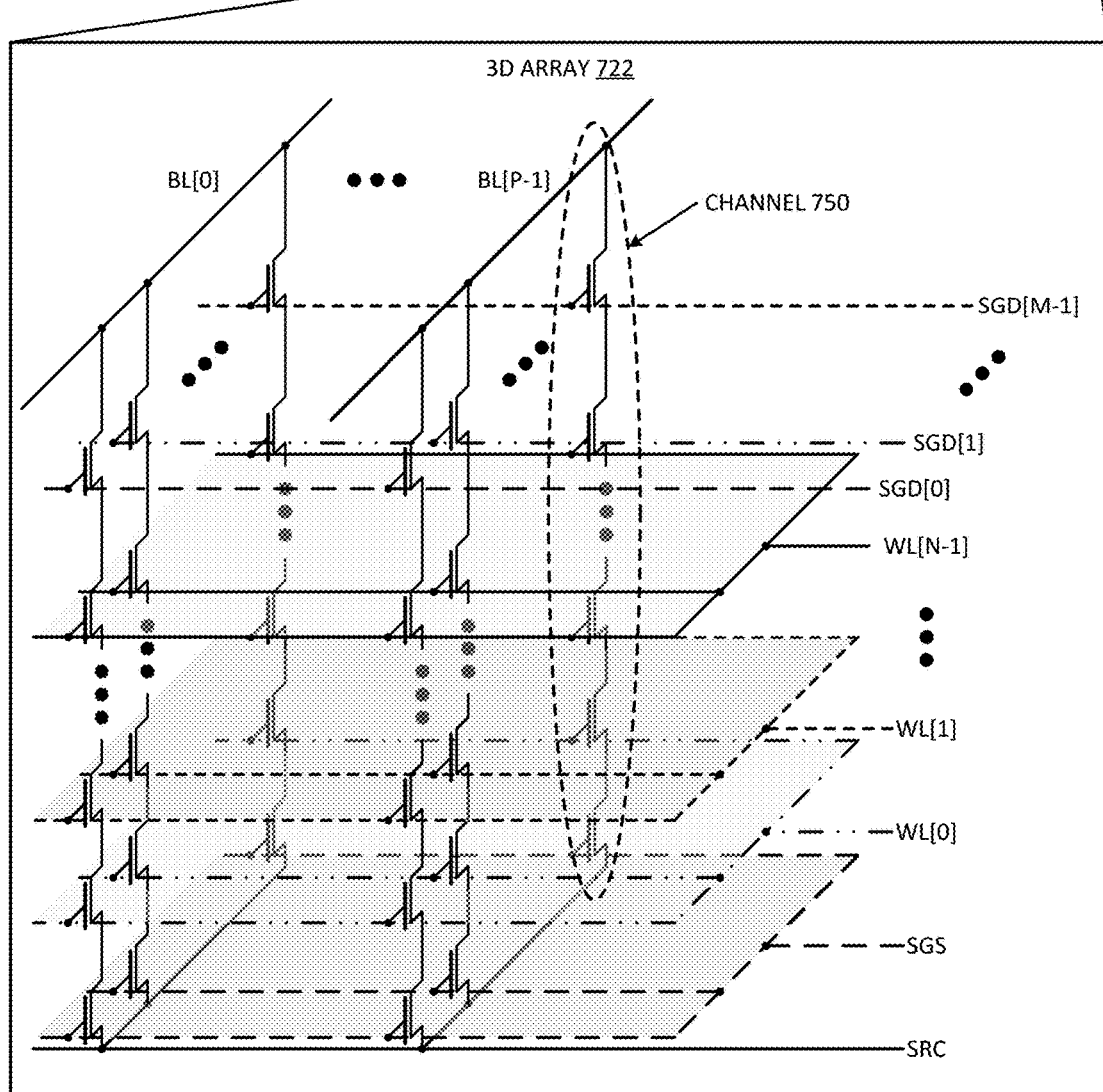

FIG. 7 is a block diagram of an example of a three-dimensional (3D) memory that services reads from a transient threshold voltage state. System 700 represents a computing device that includes a 3D memory. Host 710 represents a hardware platform that performs operations to control the functions of system 700. Host 710 includes processor 712, which is a host processor that executes the operations of the host. In one example, processor 712 is a single-core processor. In one example, processor 712 is a multicore processor device. Processor 712 can be a general purpose processor that executes a host operating system or a software platform for system 700. In one example, processor 712 is an application specific processor, a graphics processor, a peripheral processor, or other controller or processing unit on host 710. Processor 712 executes multiple agents or software programs (not specifically shown). The agents can be standalone programs and/or threads, processes, software modules, or other code and data to be operated on by processor 712.

During execution of operations by processor 712, an agent executed by the processor can request data and/or code that is not stored at host 710 (e.g., in a cache or main memory), and therefore should be obtained from memory 720. Storage controller 714 generates and processes memory access commands to memory 720 to perform the memory access. Storage controller 714 represents a circuit or logic or processor that manages access to memory 720. In one example, storage controller 714 is part of host 710. In one example, storage controller 714 is part of processor 712. In one example, storage controller 714 is integrated on a common substrate with processor 712. In one example, storage controller 714 separate chip from processor 712, and can be integrated in a multichip package (MCP) with processor 712.

Memory 720 includes controller 740, which represents a controller at the memory or storage device to process and service commands from storage controller 714. In one example, controller 740 includes stable Vt control 742, which enables controller 740 to perform stable Vt monitoring and mitigation in accordance with any example herein. In one example, stable Vt control 742 enables controller 740 to monitor the Vt state due to a power cycle. In one example, stable Vt control 742 enables controller 740 to monitor the Vt state due to a low power state. In one example, stable Vt control 742 enables controller 740 to monitor the Vt state due to an amount of time since a previous command. In one example, stable Vt control 742 enables controller 740 to monitor the Vt state due to a number of erase operations.

In one example, stable Vt control 742 represents firmware executed by controller 740. In one example, controller 740 represents a controller for a memory device. In one example, controller 740 represents a controller for a memory module. Memory 720 includes 3D array 722. In one example, 3D array 722 includes NAND memory blocks. In one example, 3D array 722 includes QLC NAND memory blocks.

As illustrated, bitlines (BL) intersect the planes of the tiers of wordlines (WL). As an example, each wordline WL[0:(N−1)] is a tier. There can be P bitlines (BL[0:(P−1)]). In one example, 3D array 722 is also divided into subblocks through SGD[0:(M−1)], which divide each wordline into separate segments within a tier or within a plane of wordlines. Alternatively, SGS can be subdivided to provide subblocks. In such a configuration, whereas SGS is shown to apply to multiple SGD lines, there could be multiple SGS lines to a single SGD line. SRC represents a common source.

Channel 750 represents a vertical channel of the 3D array. The channel refers to a vertical stack of bitcells that can be charged through a channel connector. In one example, the channels couple to the bitline. It will be understood that there can be spatial dependencies in the stable Vt state of a channel. For example, the flow of charge carriers in the channel can be different at the different ends of the channels. Thus, blocks with specific wordlines may show worse degradation than others. The operation of controller 740 to mitigate read disturb due to stable Vt in the channel can be set by thresholds and operation that mitigates the most sensitive of the wordlines.

Each label, WL[0], WL[1], SGD[0], and so forth, indicates a select signal provided by control logic of decode logic 724, or a select signal provided by control logic of sense/output logic 726. In one example, decode logic 724 includes selection logic to select each of the signal lines illustrated. In one example, sense/output logic 726 enables the sensing of the contents of bitcells of 3D array 722, for either a read operation or to write a value back to the array. The output can be for a read operation to send data back to host 710. A write operation would include writing to a buffer to apply the values to the array.

It will be understood that a signal line in 3D array 722 is a wire or trace or other conductor that provides charge from a driver to the various elements or components. A driver circuit decode logic 724 provides the charge to charge up each signal line to the desired voltage for the desired operation. Each signal line can have an associated voltage level associated with certain operations. For example, each wordline can have a select voltage and a deselect voltage to indicate, respectively, wordlines that are selected for an operation and wordlines that are not selected for an operation.

In 3D array 722, it will be understood that the length of the wordlines can be substantial. In one example, the number of tiers of wordlines is on the order of tens or dozens of wordlines (e.g., N=28, 32, 36, 70, or more). In one example, the number of subblocks is on the order of ones or tens (e.g., M=8, 76, or more). Typically, the number of bitlines in 3D array 722 will be on the order of hundreds to thousands (e.g., P=2K). Thus, in one example, each bitline is relatively short compared to the length of the wordlines.

Figure 8A:
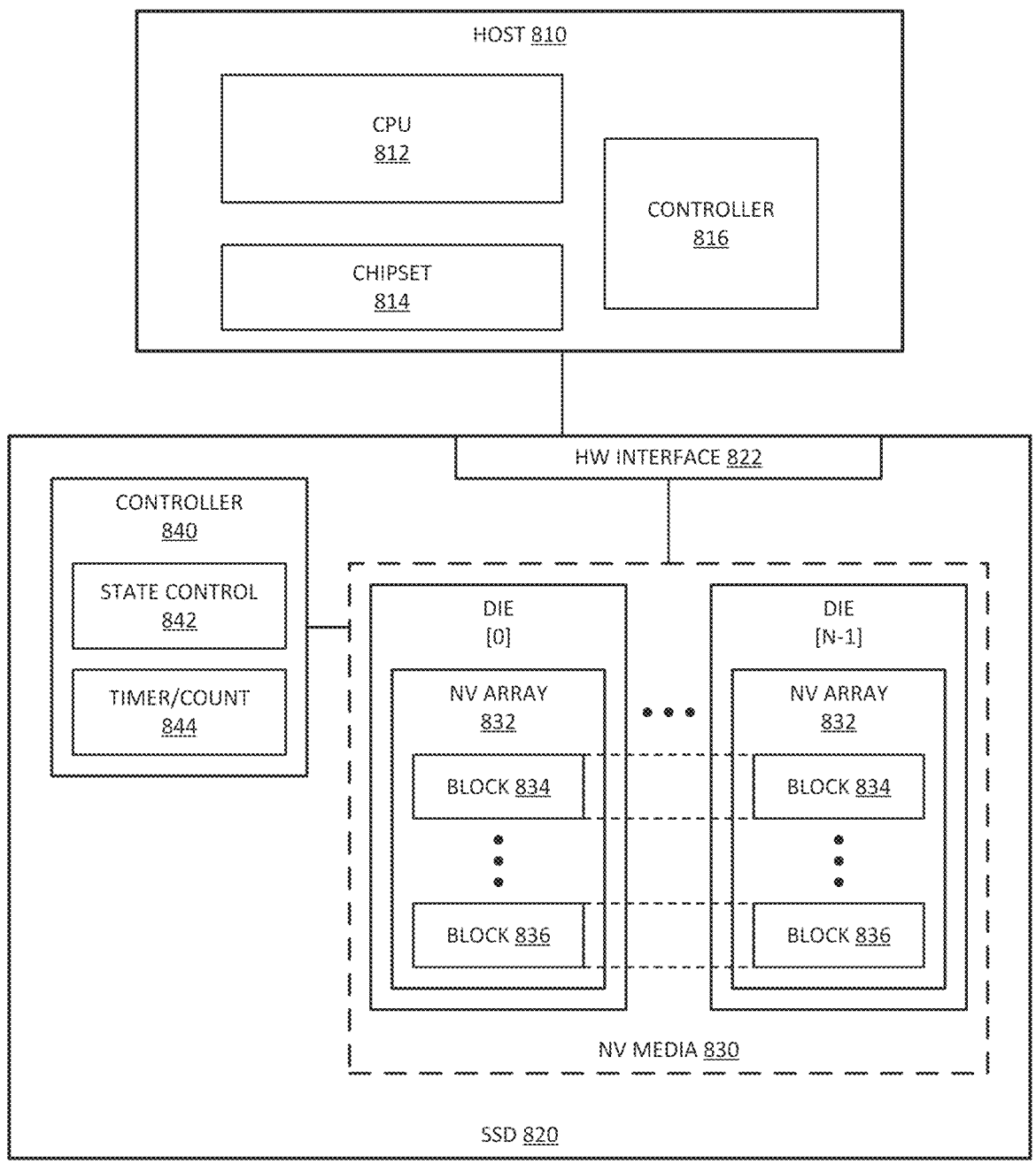
FIG. 8A is a block diagram of an example of a system with a hardware view of a solid state drive (SSD) with a nonvolatile array having dummy connectors.

FIG. 8A is a block diagram of an example of a system with a hardware view of a solid state drive (SSD) with a nonvolatile array having dummy connectors. System 802 represents components of a nonvolatile storage system that monitors and mitigates the effects of read disturb resulting from stable Vt state. System 802 can provide an example of a system in accordance with system 100 of FIG. 1. System 802 includes SSD 820 coupled with host 810. SSD 820 represents an NV device in accordance with any description herein.

Host 810 represents a host hardware platform that connects to SSD 820. Host 810 includes CPU (central processing unit) 812 or other processor as a host processor. CPU 812 represents any host processor that generates requests to access data stored on SSD 820, either to read the data or to write data to the storage. Such a processor can include a single or multicore processor, a primary processor for a computing device, a graphics processor, a peripheral processor, or a supplemental or auxiliary processor, or a combination. CPU 812 can execute a host OS and other applications to cause the operation of system 802.

Host 810 includes chipset 814, which represents hardware components that can be included in connecting between CPU 812 and SSD 820. For example, chipset 814 can include interconnect circuits and logic to enable access to SSD 820. Thus, host platform 810 can include a hardware platform drive interconnect to couple SSD 820 to host 810. Host 810 includes hardware to interconnect to the SSD. Likewise, SSD 820 includes corresponding hardware to interconnect to host 810.

Host 810 includes controller 816, which represents a storage controller or memory controller on the host side to control access to SSD 820. In one example, controller 816 is included in chipset 814. In one example, controller 816 is included in CPU 812. Controller 816 can be referred to as an NV memory controller to enable host 810 to schedule and organize commands to SSD 820 to read and write data.

SSD 820 represents a solid-state drive or other storage system or module that includes nonvolatile (NV) media 830 to store data. SSD 820 includes HW (hardware) interface 822, which represents hardware components to interface with host 810. For example, HW interface 822 can interface with one or more buses to implement a high speed interface standard such as NVMe or PCIe.

In one example, SSD 820 includes NV (nonvolatile) media 830 as the primary storage for SSD 820. In one example, NV media 830 is or includes a block addressable memory technology, such as NAND (not AND) or NOR (not OR). In one example, NV media 830 represents a 3D NAND storage. In one example, NV media 830 can include a nonvolatile, byte addressable media that stores data based on a resistive state of the memory cell, or a phase of the memory cell. For example, NV media 830 can be or include a three dimensional crosspoint (3DXP) memory or a storage array based on chalcogenide phase change material (e.g., chalcogenide glass). In one example, the NV media can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

In one example, NV media 830 is implemented as multiple dies, illustrated as N dies, Die[0:{N−1}]. N can be any number of devices, and is often a binary number. SSD 820 includes controller 840 to control access to NV media 830. Controller 840 represents hardware and control logic within SSD 820 to execute control over the media. Controller 840 is internal to the nonvolatile storage device or module, and is separate from controller 816 of host 810.

The NV dies of NV media 830 include NV array 832, which is an array of storage cells based on the NV media. In one example, NV array 832 is organized as blocks. System 802 illustrates multiple blocks 834 and 836. In one example, a block is within a single die. In one example, splits across multiple dies, as illustrated by the dashes.

In one example, controller 840 includes state control 842 to monitor the state of NV media 830 to determine if the NV media is in a stable Vt state prior to servicing a read command from host 810. The monitoring of the Vt state can be in accordance with any description herein.

In one example, controller 840 includes one or more counters or timers 844. Controller 840 uses the counters or timers to monitor the Vt state. In response to detection of a stable Vt state, controller 840 transitions NV media 830 to a transient state prior to servicing a host read command, in accordance with any description herein.

In one example, controller 840 performs monitoring and read disturb mitigation by block. Controller 840 can perform a reset read operation for only a selected block. Controller 840 can perform a reset read operation for all blocks.

Figure 8B:
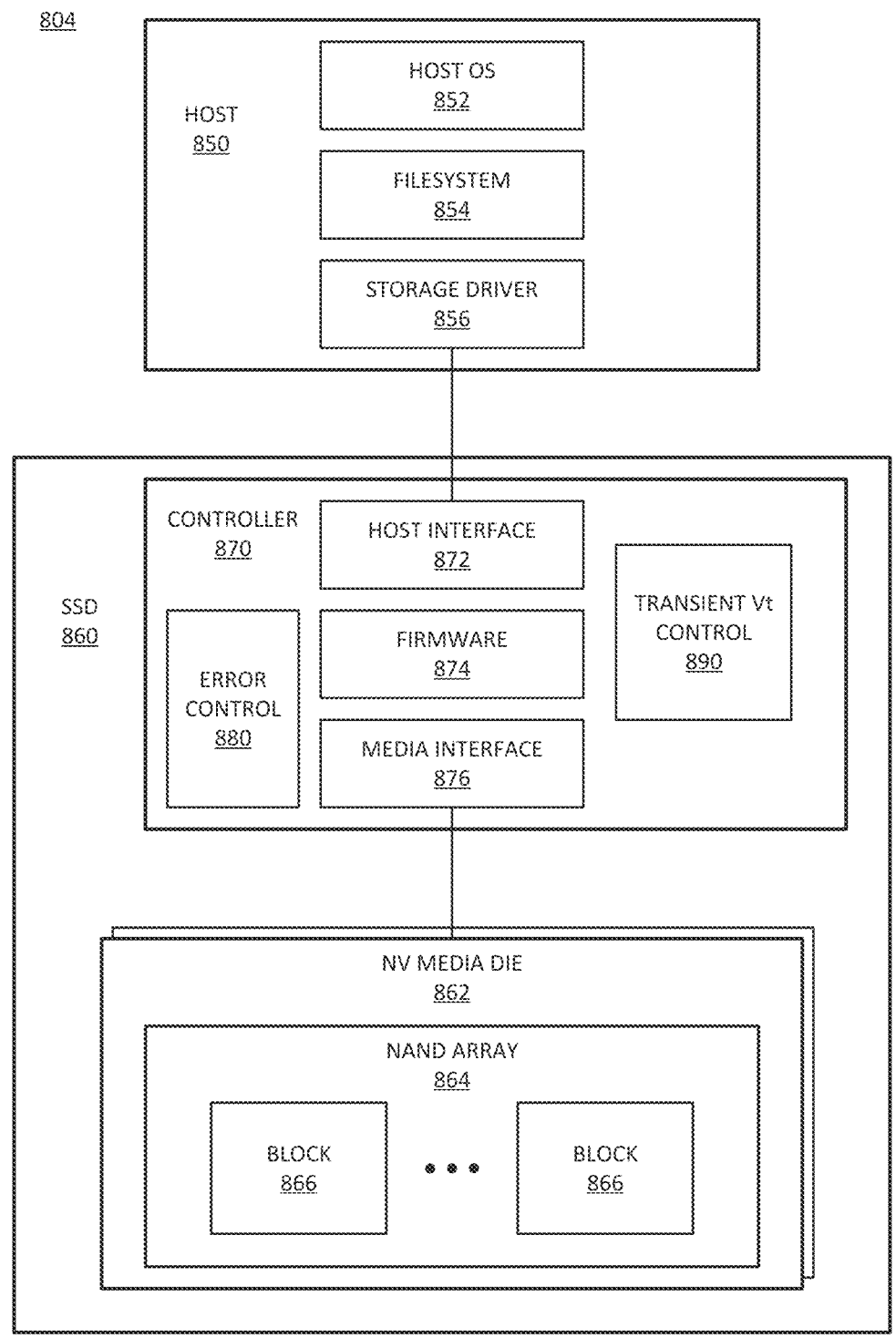
FIG. 8B is a block diagram of an example of a logical view of system with a solid state drive (SSD) with a nonvolatile array having dummy connectors.

FIG. 8B is a block diagram of an example of a logical view of system with a solid state drive (SSD) with a nonvolatile array having dummy connectors. System 804 provides one example of a system in accordance with system 802 of FIG. 8A. System 804 illustrates the logical layers of the host and SSD of a hardware platform in accordance with system 802. System 804 can represent software and firmware components of an example of system 802, as well as physical components. In one example, host 850 provides one example of host 810. In one example, SSD 860 provides one example of SSD 820.

In one example, host 850 includes host OS 852, which represents a host operating system or software platform for the host. Host OS 852 can include a platform on which applications, services, agents, and/or other software executes, and is executed by a processor. Filesystem 854 represents control logic for controlling access to the NV media. Filesystem 854 can manage what addresses or memory locations are used to store what data. There are numerous filesystems known, and filesystem 854 can implement known filesystems or other proprietary systems. In one example, filesystem 854 is part of host OS 852.

Storage driver 856 represents one or more system-level modules that control the hardware of host 850. In one example, drivers 856 include a software application to control the interface to SSD 860, and thus control the hardware of SSD 860. Storage driver 856 can provide a communication interface between the host and the SSD.

Controller 870 of SSD 860 includes firmware 874, which represents control software/firmware for the controller. In one example, controller 870 includes host interface 872, which represents an interface to host 850. In one example, controller 870 includes media interface 876, which represents an interface to NV media die 862. NV media die 862 represents a specific example of NV media, and includes an associated NV array, an example of which is illustrated with NAND array 864. NAND array 864 can be subdivided as blocks 866 or other segments or portions of the entire array.

Media interface 876 represent control that is executed on hardware of controller 870. It will be understood that controller 870 includes hardware to interface with host 850, which can be considered to be controlled by host interface software/firmware 874. Likewise, it will be understood that controller 870 includes hardware to interface with NAND die 862. In one example, code for host interface 872 can be part of firmware 874. In one example, code for media interface 876 can be part of firmware 874.

In one example, controller 870 includes error control 880 to handle data errors in accessed data, and corner cases in terms of compliance with signaling and communication interfacing. Error control 880 can include implementations in hardware or firmware, or a combination of hardware and software.

In one example, controller 870 includes transient Vt control 890. Transient Vt control 890 represents control logic to perform monitoring of Vt state of NAND array 864. Transient Vt control 890 also represents control logic to perform mitigation of read disturb by causing NAND array 864 to transition to a transient Vt state prior to servicing a read request.

Figure 9:
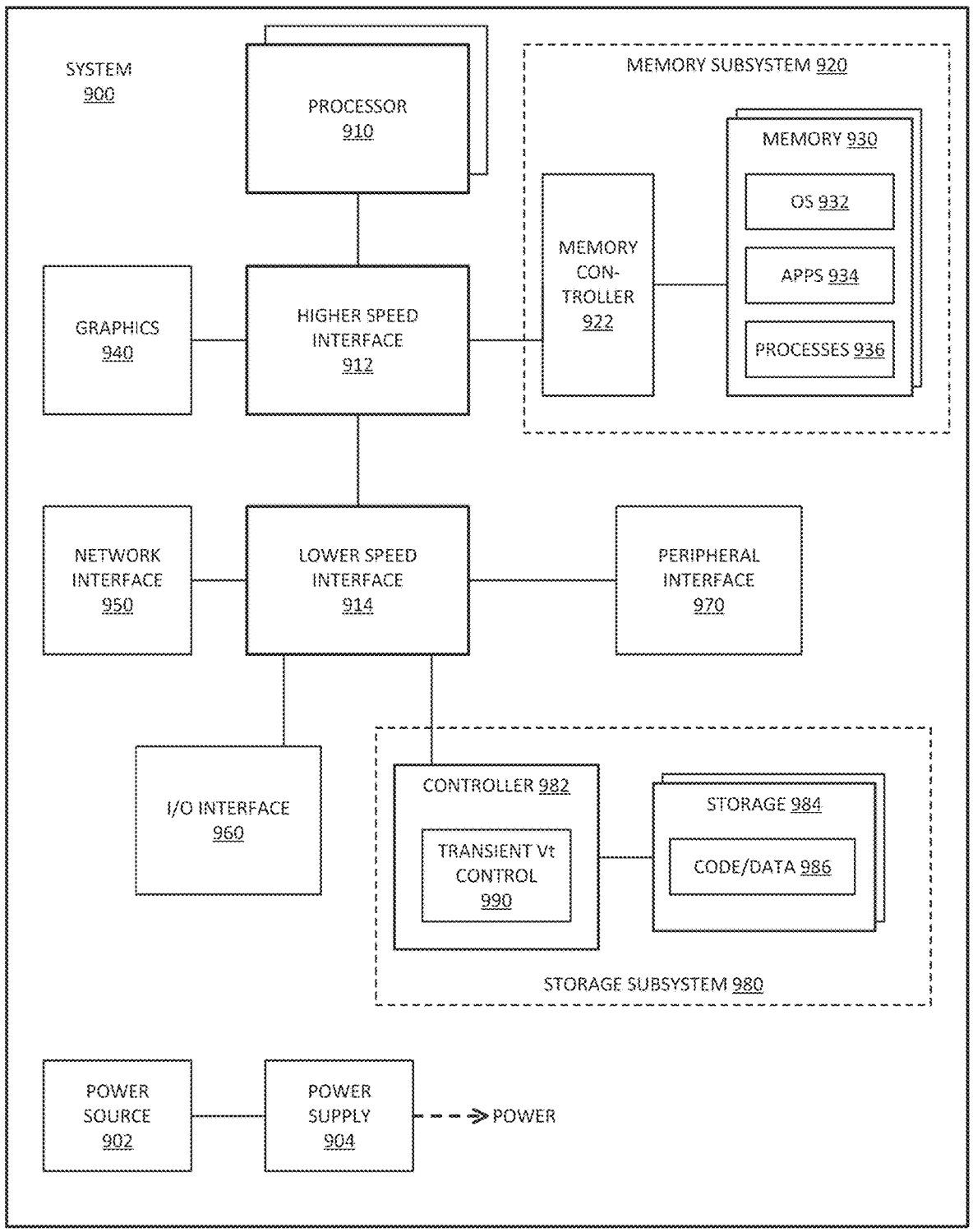
FIG. 9 is a block diagram of an example of a computing system in which nonvolatile media with dummy connectors in semi-isolated regions can be implemented.

FIG. 9 is a block diagram of an example of a computing system in which nonvolatile media with dummy connectors in semi-isolated regions can be implemented. System 900 represents a computing device in accordance with any example herein, and can be a laptop computer, a desktop computer, a tablet computer, a server, a gaming or entertainment control system, embedded computing device, or other electronic device. System 900 provides an example of a system in accordance with system 100 of FIG. 1.

In one example, system 900 includes controller 982 with transient Vt control 990. Storage 984 can be or include an NV array such as a 3D NAND array. Transient Vt control 990 represents control logic to perform monitoring of Vt state of storage 984. Transient Vt control 990 also represents control logic to perform mitigation of read disturb by causing storage 984 to transition to a transient Vt state prior to servicing a read request.

System 900 includes processor 910 can include any type of microprocessor, central processing unit (CPU), graphics processing unit (GPU), processing core, or other processing hardware, or a combination, to provide processing or execution of instructions for system 900. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include stand-alone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
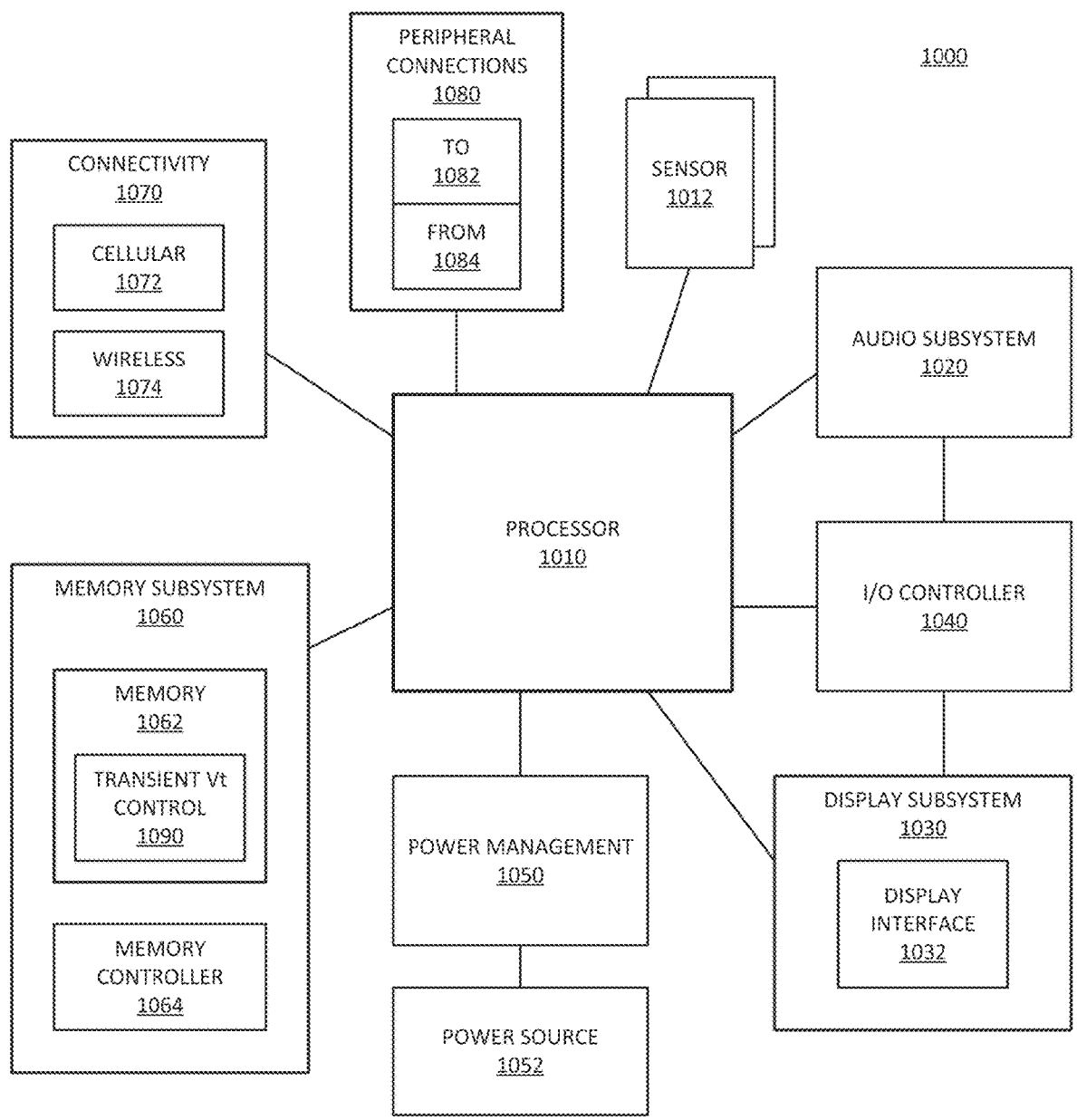
FIG. 10 is a block diagram of an example of a mobile device in which nonvolatile media with dummy connectors in semi-isolated regions can be implemented.

FIG. 10 is a block diagram of an example of a mobile device in which nonvolatile media with dummy connectors in semi-isolated regions can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000. System 1000 provides an example of a system in accordance with system 100 of FIG. 1.

In one example, system 1000 includes memory 1062 with transient Vt control 1090. Memory 1062 can be or include an NV array such as a 3D NAND array. Transient Vt control 1090 represents control logic to perform monitoring of Vt state of a storage device of memory 1062. Transient Vt control 1090 also represents control logic to perform mitigation of read disturb by causing memory 1062 to transition to a transient Vt state prior to servicing a read request.

System 1000 includes processor 1010, which performs the primary processing operations of system 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, buttons/switches, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general, with respect to the descriptions herein, in one example a memory device includes: a nonvolatile (NV) storage media; and a storage controller to control access to the NV storage media, the storage controller to determine, in response to a host read request, if the NV storage media is in a stable Vt (threshold voltage) state, and to perform a reset read operation in response to a determination that the NV storage media is in the stable Vt state prior to service of the host read request, the reset read operation to perform a read operation where data is not to be returned to a host that sent the host read request.

In one example, determine if the NV storage media is in the stable Vt state comprises the storage controller is to determine if the memory device is booting from a power cycle. In one example, determine if the NV storage media is in the stable Vt state comprises the storage controller is to determine if a time in a low power state has reached a threshold time. In one example, determine if the NV storage media is in the stable Vt state comprises the storage controller is to determine if a time since a last read has reached a threshold time. In one example, determine if the NV storage media is in the stable Vt state comprises the storage controller is to determine if a number of erase operations has reached a threshold number of erase operations. In one example, the NV storage media is organized as blocks of memory, and wherein perform the reset read operation comprises the storage controller to perform the reset read operation for only a selected block. In one example, the NV storage media is organized as blocks of memory, and wherein perform the reset read operation comprises the storage controller to perform the reset read operation for all blocks. In one example, the NV storage media comprises three-dimensional (3D) NAND memory. In one example, the 3D NAND memory comprises quad level cell (QLC) NAND memory.

In general, with respect to the descriptions herein, in one example a system includes: a host processor to send a host read request; and a memory device including a nonvolatile (NV) storage media; and a storage controller to control access to the NV storage media, the storage controller to determine, in response to the host read request, if the NV storage media is in a stable Vt (threshold voltage) state, and to perform a reset read operation in response to a determination that the NV storage media is in the stable Vt state prior to service of the host read request, the reset read operation to perform a read operation where data is not to be returned to the host processor.

In one example, determine if the NV storage media is in the stable Vt state comprises the storage controller is to determine if the memory device is booting from a power cycle, or if a time in a low power state has reached a threshold time, or if a time since a last read has reached a threshold time, or if a number of erase operations has reached a threshold number of erase operations. In one example, the NV storage media is organized as blocks of memory, and wherein perform the reset read operation comprises the storage controller to perform the reset read operation for only a selected block. In one example, the NV storage media is organized as blocks of memory, and wherein perform the reset read operation comprises the storage controller to perform the reset read operation for all blocks. In one example, the NV storage media comprises three-dimensional (3D) NAND memory. In one example, the 3D NAND memory comprises quad level cell (QLC) NAND memory. In one example, the system further includes one or more of: wherein the host processor comprises a multicore processor device coupled to the memory device; a display communicatively coupled to the host processor; a network interface communicatively coupled to the host processor; or a battery to power the system.

In general, with respect to the descriptions herein, in one example a method includes: determining, in response to a host read request, if a nonvolatile (NV) storage media is in a stable Vt (threshold voltage) state; and performing a reset read operation in response to a determination that the NV storage media is in the stable Vt state prior to service of the host read request, the reset read operation to perform a read operation where data is not to be returned to a host that sent the host read request.

In one example, determining if the NV storage media is in the stable Vt state comprises determining if the memory device is booting from a power cycle, or determining if a time in a low power state has reached a threshold time, or determining if a time since a last read has reached a threshold time, or determining if a number of erase operations has reached a threshold number of erase operations. In one example, the NV storage media is organized as blocks of memory, and wherein performing the reset read operation comprises performing the reset read operation for only a selected block. In one example, the NV storage media is organized as blocks of memory, and wherein performing the reset read operation comprises performing the reset read operation for all blocks.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
a nonvolatile (NV) storage media; and
a storage controller to control access to the NV storage media, the storage controller to determine, in response to a host read request, if the NV storage media is in a stable Vt (threshold voltage) state where the NV storage media is at thermal equilibrium, and to perform a reset read operation in response to a determination that the NV storage media is in the stable Vt state prior to servicing of the host read request, the reset read operation to perform a read operation to put the NV storage media in a state of thermal non-equilibrium where data is not to be returned to a host that sent the host read request.

2. The memory device of claim 1, wherein determine if the NV storage media is in the stable Vt state comprises the storage controller is to determine if the memory device is booting from a power cycle.

3. The memory device of claim 1, wherein determine if the NV storage media is in the stable Vt state comprises the storage controller is to determine if a time in a low power state has reached a threshold time.

4. The memory device of claim 1, wherein determine if the NV storage media is in the stable Vt state comprises the storage controller is to determine if a time since a last read has reached a threshold time.

5. The memory device of claim 1, wherein determine if the NV storage media is in the stable Vt state comprises the storage controller is to determine if a number of erase operations has reached a threshold number of erase operations.

6. The memory device of claim 1, wherein the NV storage media is organized as blocks of memory, and wherein perform the reset read operation comprises the storage controller to perform the reset read operation for only a selected block.

7. The memory device of claim 1, wherein the NV storage media is organized as blocks of memory, and wherein perform the reset read operation comprises the storage controller to perform the reset read operation for all blocks.

8. The memory device of claim 1, wherein the NV storage media comprises three-dimensional (3D) NAND memory.

9. The memory device of claim 8, wherein the 3D NAND memory comprises quad level cell (QLC) NAND memory.

10. A system, comprising:
a host processor to send a host read request; and
a memory device including
a nonvolatile (NV) storage media; and
a storage controller to control access to the NV storage media, the storage controller to determine, in response to the host read request, if the NV storage media is in a stable Vt (threshold voltage) state where the NV storage media is at thermal equilibrium, and to perform a reset read operation in response to a determination that the NV storage media is in the stable Vt state prior to servicing of the host read request, the reset read operation to perform a read operation to put the NV storage media in a state of thermal non-equilibrium where data is not to be returned to a host that sent the host read request.

11. The system of claim 10, wherein determine if the NV storage media is in the stable Vt state comprises the storage controller is to determine if the memory device is booting from a power cycle, or if a time in a low power state has reached a threshold time, or if a time since a last read has reached a threshold time, or if a number of erase operations has reached a threshold number of erase operations.

12. The system of claim 10, wherein the NV storage media is organized as blocks of memory, and wherein perform the reset read operation comprises the storage controller to perform the reset read operation for only a selected block.

13. The system of claim 10, wherein the NV storage media is organized as blocks of memory, and wherein perform the reset read operation comprises the storage controller to perform the reset read operation for all blocks.

14. The system of claim 10, wherein the NV storage media comprises three-dimensional (3D) NAND memory.

15. The system of claim 14, wherein the 3D NAND memory comprises quad level cell (QLC) NAND memory.

16. The system of claim 10, further comprising one or more of:
wherein the host processor comprises a multicore processor device coupled to the memory device;
a display communicatively coupled to the host processor;
a network interface communicatively coupled to the host processor; or
a battery to power the system.

17. A method comprising:
determining, in response to a host read request, if a nonvolatile (NV) storage media is in a stable Vt (threshold voltage) state where the NV storage media is at thermal equilibrium; and performing a reset read operation in response to a determination that the NV storage media is in the stable Vt state prior to servicing the host read request, the reset read operation to perform a read operation to put the NV storage media in a state of thermal non-equilibrium where data is not to be returned to a host that sent the host read request.

18. The method of claim 17, wherein determining if the NV storage media is in the stable Vt state comprises determining if a memory device having the NV storage media is booting from a power cycle, or determining if a time in a low power state has reached a threshold time, or determining if a time since a last read has reached a threshold time, or determining if a number of erase operations has reached a threshold number of erase operations.

19. The method of claim 17, wherein the NV storage media is organized as blocks of memory, and wherein performing the reset read operation comprises performing the reset read operation for only a selected block.

20. The method of claim 17, wherein the NV storage media is organized as blocks of memory, and wherein performing the reset read operation comprises performing the reset read operation for all blocks.

\* \* \* \* \*